(12) United States Patent
Ishikawa et al.

(10) Patent No.: US 6,952,037 B2
(45) Date of Patent: Oct. 4, 2005

(54) ELECTROSTATIC DISCHARGE SEMICONDUCTOR PROTECTION CIRCUIT OF REDUCED AREA

(75) Inventors: Yasuhisa Ishikawa, Kanagawa (JP); Atsushi Watanabe, Kanagawa (JP); Yukihiro Terada, Kanagawa (JP); Akira Ikeuchi, Kanagawa (JP); Hiroshi Oya, Kanagawa (JP)

(73) Assignee: Mitsumi Electric Co., Ltd., Tokyo (JP)

( * ) Notice: Subject to any disclaimer, the term of this patent is extended or adjusted under 35 U.S.C. 154(b) by 0 days.

(21) Appl. No.: 10/658,781

(22) Filed: Sep. 10, 2003

(65) Prior Publication Data

US 2004/0124471 A1 Jul. 1, 2004

(30) Foreign Application Priority Data

Sep. 30, 2002 (JP) .................................... P2002-287199

(51) Int. Cl.[7] .............................................. H01L 23/60
(52) U.S. Cl. ....................... 257/355; 257/358; 257/356; 257/360
(58) Field of Search ................................. 257/355, 358, 257/356, 360, 546, 328, 173

(56) References Cited

U.S. PATENT DOCUMENTS

| | | | | |
|---|---|---|---|---|
| 4,072,976 A | * | 2/1978 | Harari | 257/356 |
| 5,563,525 A | * | 10/1996 | Lee | 326/30 |
| 5,638,246 A | * | 6/1997 | Sakamoto et al. | 361/103 |
| 5,748,459 A | * | 5/1998 | Yamada et al. | 363/56.03 |
| 5,965,920 A | * | 10/1999 | Sung | 257/355 |
| 5,977,594 A | * | 11/1999 | Takao | 257/357 |
| 6,320,231 B1 | * | 11/2001 | Ikehashi et al. | 257/355 |
| 6,462,383 B1 | * | 10/2002 | Matsumoto | 257/360 |
| 6,469,354 B1 | * | 10/2002 | Hirata | 257/358 |
| 6,545,321 B2 | * | 4/2003 | Morishita | 257/355 |
| 6,559,508 B1 | * | 5/2003 | Lin et al. | 257/360 |
| 6,573,566 B2 | * | 6/2003 | Ker et al. | 257/355 |
| 6,670,679 B2 | * | 12/2003 | Hirata | 257/360 |
| 6,760,204 B2 | * | 7/2004 | Hayashida et al. | 361/56 |

* cited by examiner

*Primary Examiner*—Tom Thomas
*Assistant Examiner*—Eugene Lee
(74) *Attorney, Agent, or Firm*—Whitham, Curtis & Christofferson, P.C.

(57) ABSTRACT

A semiconductor device includes a substrate, a well region formed in the substrate, a field effect transistor formed in the well region, and a diffused region, formed across the well region and the substrate for applying back gate potential to the well region, and forming a PN junction together with its periphery. The field effect transistor and the PN junction are connected between terminals for absorbing excess current so that an internal circuit connected to the terminals is protected.

8 Claims, 11 Drawing Sheets

ELECTROSTATIC DISCHARGE SEMICONDUCTOR PROTECTION CIRCUIT OF REDUCED AREA

BACKGROUND OF THE INVENTION

The present invention relates to a semiconductor device, particularly relates to a semiconductor device in which a protection circuit for protecting from electrostatic discharge is built.

A device forming a semiconductor integrated circuit (IC) is minute and is easily broken by electrostatic discharge (ESD). Therefore, a protection circuit for protecting an internal circuit from electrostatic discharge caused outside is built in the semiconductor integrated circuit, and various ESD tests according to requests from users and others are made. As a static electricity applied model used in the ESD test, a human body model and a machine model are represented.

This type (the human body model and the machine model) of protection circuit ordinarily includes a protection circuit using a transistor or a protection circuit using a diode.

The protection circuit using a transistor and the protection circuit using a diode will be described below.

FIG. 11 is a circuit diagram showing the protection circuit using a field effect transistor.

The protection circuit 700 using the field effect transistor includes the field effect transistor 701 which is provided between a power supply terminal 703 for supplying power to an internal circuit 702 and an input/output terminal 704 for inputting/outputting a signal to/from the internal circuit 702. The drain of the field effect transistor 701 is connected to the power supply terminal 703. The source and the gate of the field effect transistor 701 are connected to the input/output terminal 704.

Owing to the configuration, when the potential of the input/output terminal 704 increases because of electrostatic discharge, the field effect transistor 701 is turned on to discharge electric charge caused by electrostatic discharge into the power supply terminal 703 so that the potential of the input/output terminal 704 is clamped.

FIG. 12 shows a characteristic of the protection circuit using the transistor and FIG. 13 show the voltage/current characteristics of the transistor and a diode. FIG. 13A shows the characteristic of voltage on a time base when a pulse is applied and FIG. 13B shows the characteristic of current on a time base when the pulse is applied.

FIGS. 12, 13A and 13B show the characteristics in case the transistor and the diode have the same size.

The impedance ($\Delta$ V1/$\Delta$ I1) of the transistor shown by a full line in FIG. 12 is smaller, compared with the impedance ($\Delta$ V2/$\Delta$ I2) of the diode shown by a broken line in FIG. 12. However, in the transistor 701, a characteristic represented by a curved full line in FIGS. 12 and 13A, that is, so-called snapback effect is caused. The rise time of current is delayed by $\tau$ because of the snapback effect as shown by a full line in FIG. 13B. Therefore, correspondence with respect to the input of ESD having a rising waveform of which is sharper than that in a human body model or a machine model for example is delayed, and the internal circuit and a protective device may be broken.

FIG. 14 is a circuit diagram showing the protection circuit using a diode.

The protection circuit 800 using a diode includes a diode 801 which is provided between a power supply terminal 803 and an input/output terminal 804. The cathode of the diode 801 is connected to the power supply terminal 803 and the anode of the diode 801 is connected to the input/output terminal 804.

Owing to the configuration, when the potential of the input/output terminal 804 increases because of electrostatic discharge, the diode 801 is turned on to discharge the electrostatic discharge into the power supply terminal 803 so that the input/output terminal 804 is clamped at predetermined potential.

FIG. 15 show characteristics of the protection circuit using the diode. FIG. 15A shows a characteristic of voltage on a time base when a pulse is applied and FIG. 15B shows a characteristic of current on the time base when the pulse is applied.

In the diode 801, voltage and current rise in response to an input pulse substantially at the same time as shown in FIG. 15. However, after the rise, impedance is increased as shown in FIG. 15A. Therefore, for protecting the internal circuit from the input of higher-voltage ESD than that in a human body model or a machine model, the device is required to be large-sized to reduce impedance.

In the above mentioned, for requests from users for ESD tests, there is a case that a test using a very higher-voltage and high-speed ESD pulse, compared with a human body model or a machine model is requested.

However, as first transition until a transistor is turned on is delayed by the above-mentioned snapback effect in case the above-mentioned test is made in a protection circuit using the transistor, a problem that the protection circuit cannot correspond to an ESD pulse the leading edge of which is sharp and an internal circuit may be broken occurs.

Also, in case the above-mentioned test is made in a protection circuit using a diode, the area of a device is required to be increased to reduce the impedance. Therefore, to correspond to a high-voltage ESD pulse, a problem that the device in which the protection circuit is to be mounted is large-sized occurs.

SUMMARY OF THE INVENTION

It is therefore an object of the present invention to provide a small-sized semiconductor device that can enhance the speed of a response and the quantity of withstand voltage.

In order to achieve the above object, according to the present invention, there is provided A semiconductor device, comprising:

a substrate (31);

a well region (32), formed in the substrate (31);

a field effect transistor (Q1), formed in the well region (32); and a diffused region (44), formed across the well region (32) and the substrate (31) for applying back gate potential to the well region (32), and forming a PN junction (D1) together with its periphery, wherein the field effect transistor (Q1) and the PN junction (D1) are connected between terminals (Tin, Tout, Ts, Tgnd) for absorbing excess current so that an internal circuit (11) connected to the terminals (Tin, Tout, Ts, Tgnd) is protected.

In the above configuration, as the rise of current can be dealt with by the PN junction (D1) at high speed by connecting the field effect transistor (Q1) and the PN junction (D1) between the terminals (Tin, Tout, Ts, Tgnd) and configuring so that excess current between the terminals (Tin, Tout, Ts, Tgnd) is absorbed and current can be absorbed at low impedance by the field effect transistor (Q1) after the rise of current, the quantity of withstand voltage can be enhanced.

Preferably, a gate of the field effect transistor (Q1) comprises:

a gate oxide film (36) formed on a channel;

a protective film (37) formed on the gate oxide film (36); and a conductive material (38) formed on the protective film.

In the above configuration, as insulating films (36, 37) of the gate can be thickened, the quantity of withstand voltage of the field effect transistor (Q1) can be enhanced.

Here, it is preferable that, the gate of the field effect transistor (Q1) is comprised of metal.

In the above configuration, as the withstand voltage of the gate oxide film of the field effect transistor (Q1) can be enhanced by making the gate of the field effect transistor (Q1) of metal, this aspect can correspond to a case such as an electrostatic discharge test that large withstand voltage is required.

Preferably, the field effect transistor is a plurality of field effect transistors (Q11 to Q14) which are provided in the well region (32); and wherein the field effect transistors (Q11 to Q14) share a gate and a drain.

In the above configuration, as current can be dispersed and bypassed into the plural field effect transistors (Q11 to Q14) by providing the plural field effect transistors (Q11 to Q14) in the well region (32) and sharing the gates and the drains of the plural field effect transistors (Q11 to Q14), the fourth aspect can correspond to heavy-current. Besides, as the gates and the drains of the plural field effect transistors (Q11 to Q14) are shared and are formed in the same well region (32), the protection circuit according to the fourth aspect can be realized by small space.

Preferably, the semiconductor device further comprising an impedance element (R1) having larger impedance than the impedance of the field effect transistor (Q1) and a diode forming the PN junction in a case that the field effect transistor (Q1) and the diode (D1) are turned on, wherein the impedance element is arranged between the internal circuit (11) and at least one of the field effect transistor (Q1) and the diode (D1).

In the above configuration, heavy-current can be prevented from flowing on the side of the internal circuit (11) when current is absorbed by the field effect transistor (Q1) and the diode (D1) by providing the impedance element (R1) having larger impedance than the impedance of the field effect transistor (Q1) and the diode (D1) when the field effect transistor (Q1) and the diode (D1) are turned on between the field effect transistor (Q1) and the diode (D1) and between the protection circuit and the internal circuit (11)

Preferably, the semiconductor device further comprises a second diffused region (45) connected to the diffused region (44) so that the PN junction (D1) is formed with the diffused region (44).

According to the present invention, there is also provided a semiconduct or device (1), comprising:

an internal circuit (11), connected to a plurality of terminals (Tin, Tout, Ts, Tgnd);

a protection circuit (12), connected between the terminals (Tin, Tout, Ts, Tgnd) for protecting the internal circuit (11), wherein the protection circuit (12) includes:

a first element (D1), having a rising edge of current equivalent to that of a diode as a response to current that flows according to potential difference between the terminals (Tin, Tout, Ts, Tgnd); and a second element (Q1), having a impedance equivalent to that of a transistor after the rise edge of current.

In the above configuration, as the first element (D1) can correspond to the rise of current at high speed and after the rise of current, current can be absorbed at low impedance by the second element (Q1) by connecting the second element (Q1) made the similar impedance to that of a transistor after the rise of current and the first element (D1) separately provided from the second element (Q1) and a response of which to current that flows according to potential difference between the terminals (Tin, Tout, Ts, Tgnd) has the similar first transition to that of a diode between the terminals (Tin, Tout, Ts, Tgnd) and configuring so that excess current between the terminals (Tin, Tout, Ts, Tgnd) is absorbed, the withstand voltage can be enhanced.

BRIEF DESCRIPTION OF THE DRAWINGS

The above objects and advantages of the present invention will become more apparent by describing in detail preferred exemplary embodiments thereof with reference to the accompanying drawings, wherein.

DETAILED DESCRIPTION OF THE PREFERRED EMBODIMENTS

Figure 1:
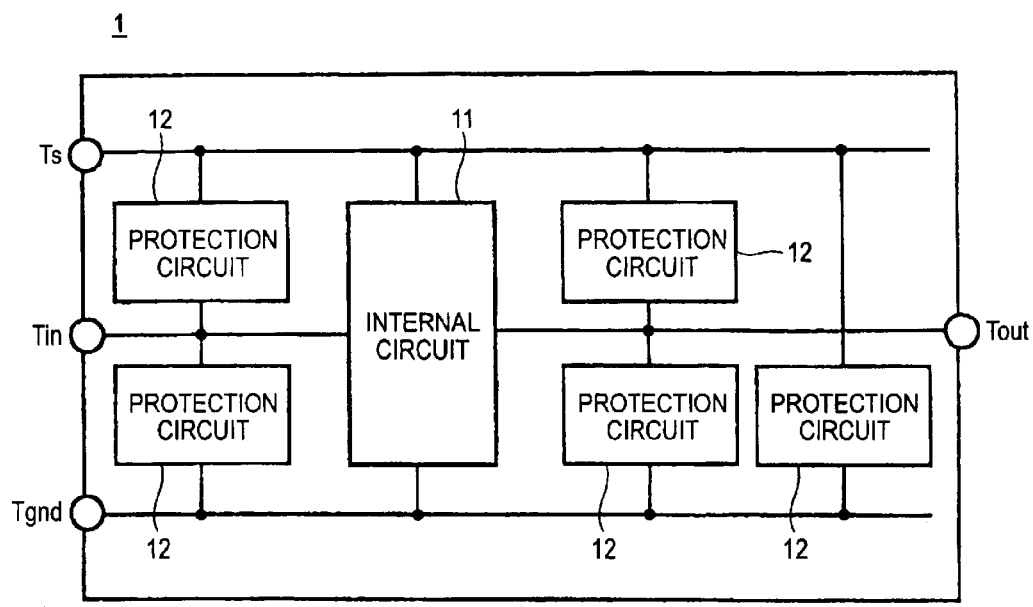
FIG. 1 is a block diagram showing a semiconductor device according to a first embodiment of the invention.

FIG. 1 is a block diagram showing a semiconductor device according to the first embodiment of the invention.

The semiconductor device 1 of the first embodiment includes an internal circuit 11 and a protection circuit 12.

A power supply terminal Ts, a grounding terminal Tgnd, an input terminal Tin and an output terminal Tout are connected to the internal circuit 11. The internal circuit 11 is driven according to power supply voltage Vdd supplied to the power supply terminal Ts, applies predetermined processing to an input signal supplied to the input terminal Tin and outputs from the output terminal Tout.

The protection circuits 12 are connected between the power supply terminal Ts and the input terminal Tin, between the input terminal Tin and the grounding terminal Tgnd, between the power supply terminal Ts and the output terminal Tout, between the output terminal Tout and the grounding terminal Tgnd and between the power supply terminal Ts and the grounding terminal Tgnd respectively. The protection circuit 12s bypass excess current to prevent the excess current caused at the power supply terminal Ts, the grounding terminal Tgnd, the input terminal Tin and the output terminal Tout from being supplied to the internal circuit 11.

Figure 2:
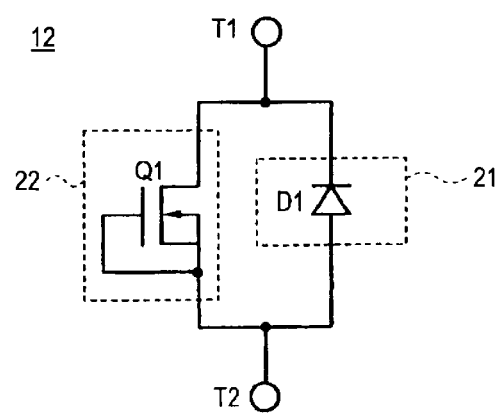
FIG. 2 is a circuit diagram showing a protection circuit 12.

FIG. 2 is a circuit diagram showing the protection circuit of the semiconductor device according to the first embodiment of the invention.

The protection circuit 12 includes a first protective element 21 and a second protective element 22 which are connected in parallel. The second protective element 22 has a characteristic called a snapback and has the similar impedance to that of a field effect transistor after the rise of voltage between the terminals. The first protective element 21 is an element a response of which to current that flows according to potential difference between the terminals rises up to the similar extent to that of the diode. For example, the first protective element 21 has a diode D1.

Figure 13A:
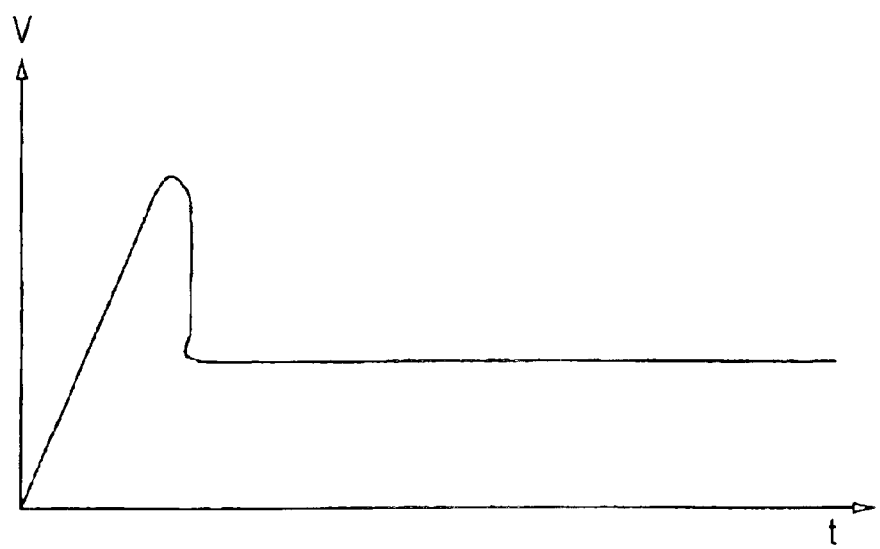
FIG. 13 show the voltage-current characteristics of a transistor and a diode.
Figure 13B:
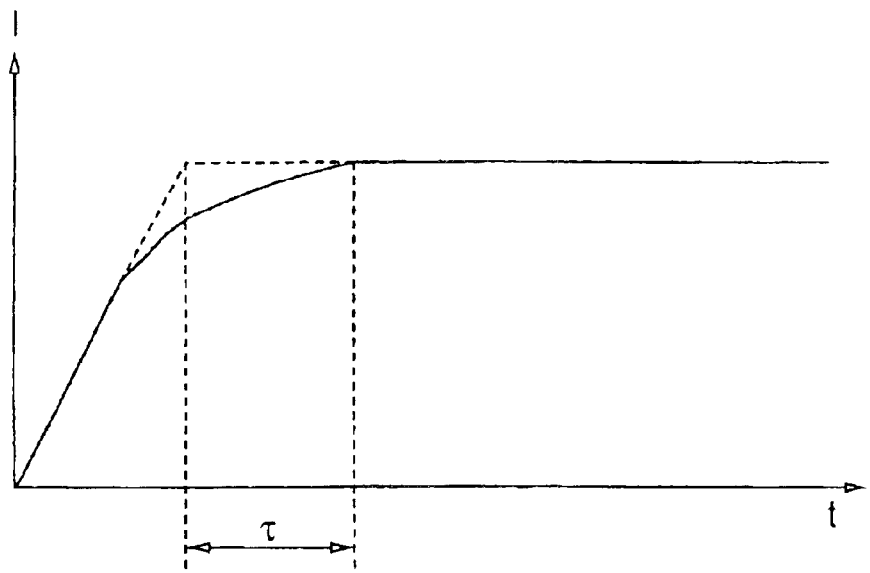
Figure 14:
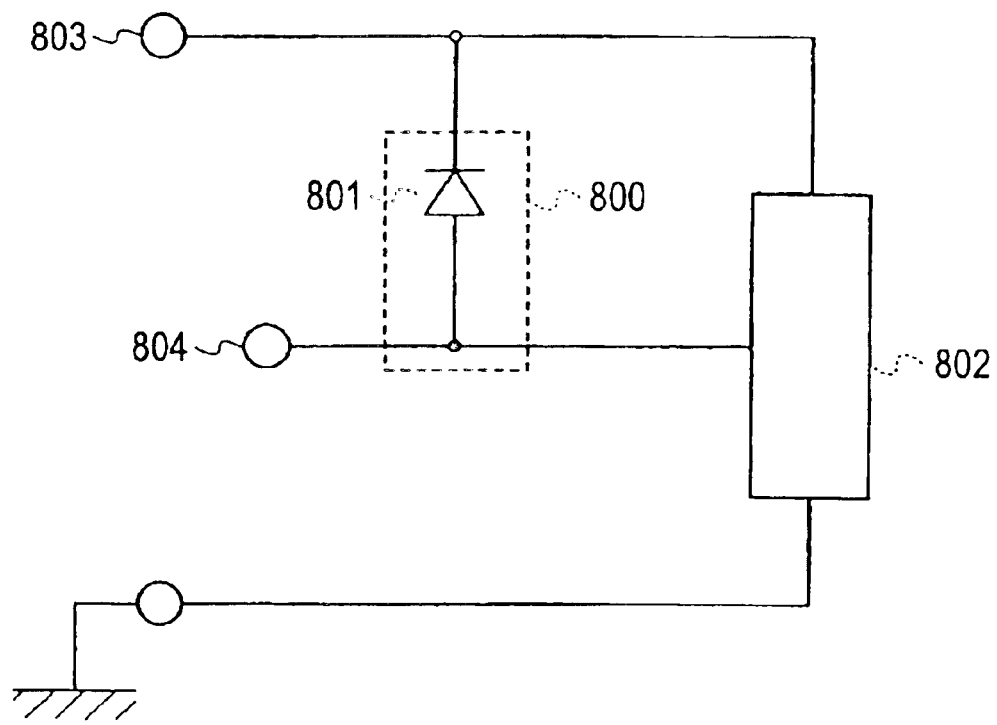
FIG. 14 is a circuit diagram showing a protection circuit using a diode.

Besides, in the second protective element 22, in case a pulse shape is applied to both ends at time t0, current gradually rises as shown in FIG. 13B. On the other hand, after voltage once rises because of snapback effect, it is kept low in a stable state by keeping impedance low.

Figure 15A:
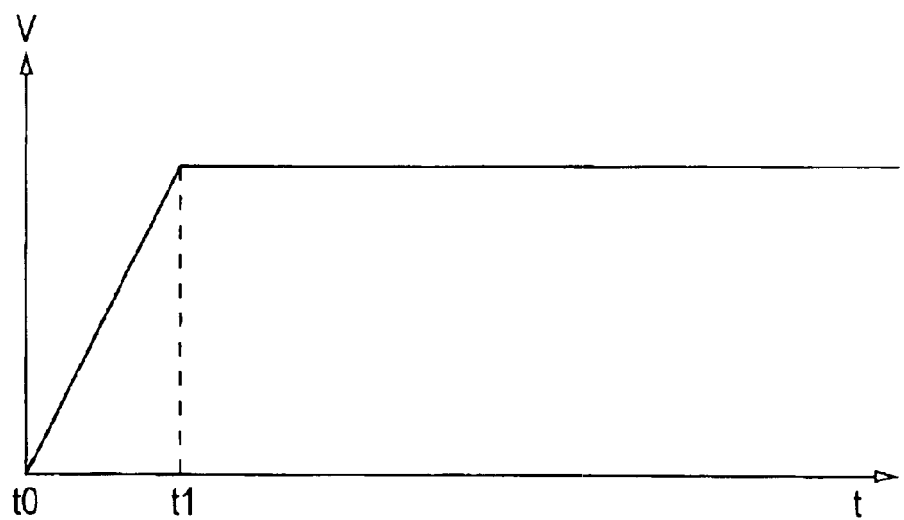
FIGS. 15a and 15B show characteristics of the protection circuit using the diode.
Figure 15B:
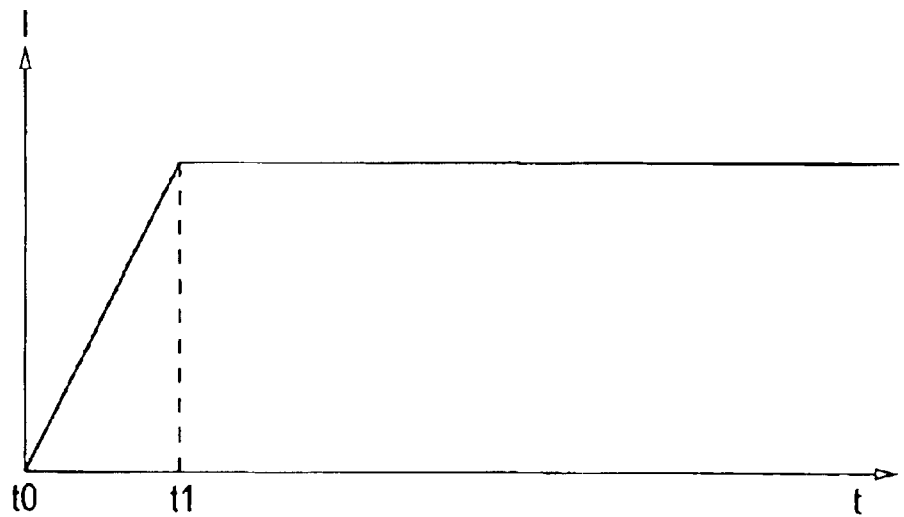

In the first protective element 21, in case a pulse shape is applied to both ends at time t0, current abruptly flows as shown in FIG. 15B. Voltage applied to the first protective element 21 is held at a fixed level after the voltage is stabilized at time t1 as shown in FIG. 15A.

The protection circuit 12 in this embodiment has the second protective element 22 showing characteristics shown in FIG. 13 and the first protective element 21 showing characteristics shown in FIG. 15 which are connected in parallel.

Figure 3A:
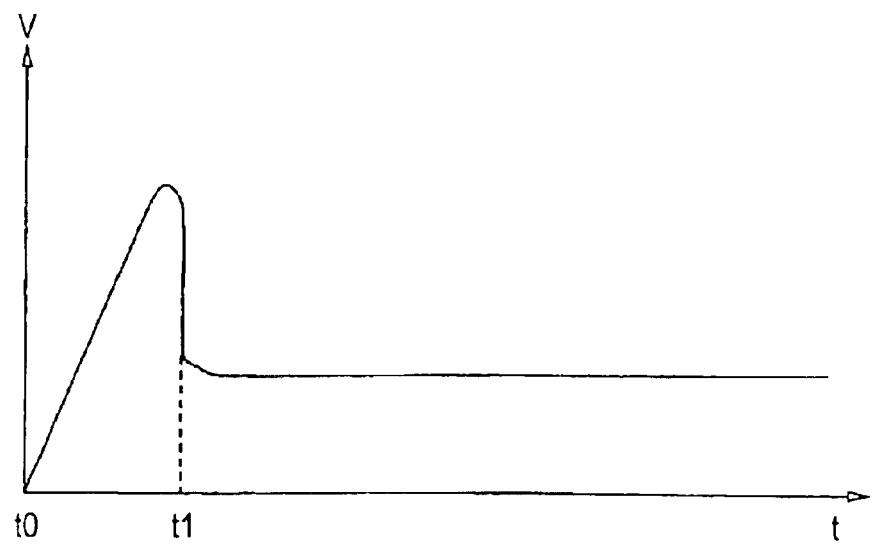
FIG. 3 show characteristics of the protection circuit 12.
Figure 3B:
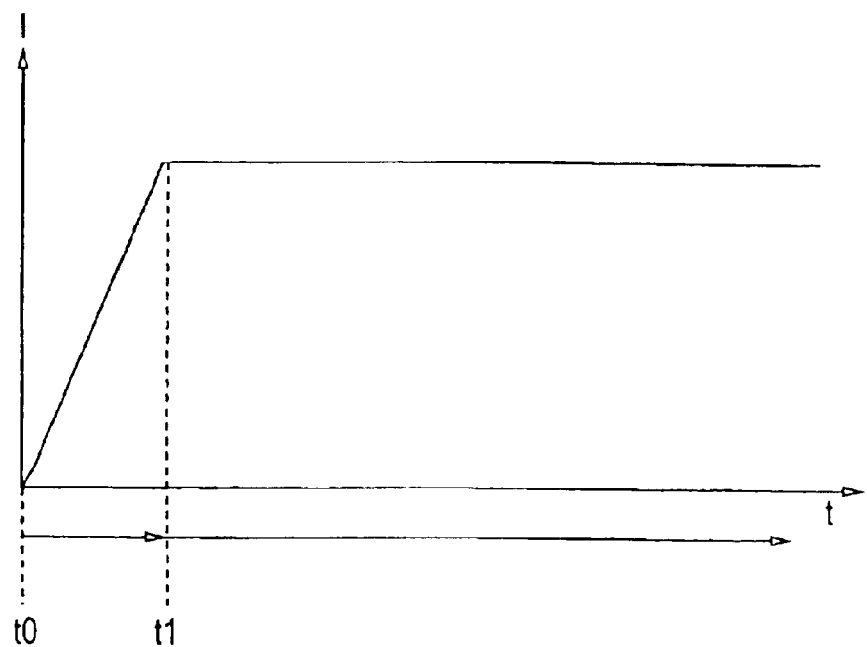

FIG. 3 is an explanatory drawing for explaining the operation of the protection circuit 12. FIG. 3A shows a characteristic of voltage on a time base when a pulse is applied and FIG. 3B shows a characteristic of current on the time base when the pulse is applied.

The protection circuit 12 can realize the characteristic shown in FIG. 3A in which a leading edge is sharp as shown in FIG. 3B since the first protective element 21 is operated in activation, and after the first transition of a pulse, the second protective element 22 is operated in addition to the first protective element 21 to keep at low impedance between terminals in a stable state. As described above, the protection circuit 12 can realize low impedance with a sharp response. Hereby, the protection circuit 12 can correspond to an ESD surge the first transition of which is speedy and the voltage of which is high.

At this time, as current is bypassed via a field effect transistor Q1 which forms the second protective element 22 and the impedance of which is relatively small after the first transition of current is finished, voltage never rises. Therefore, the area of the diode D1 forming the first protective element 21 can be reduced. Hereby, the space of the protective circuit 12 can be reduced.

The first protective element 21 and the second protective element 22 share a diffused region. Therefore, the protection circuit can be further miniaturized.

Figure 4:
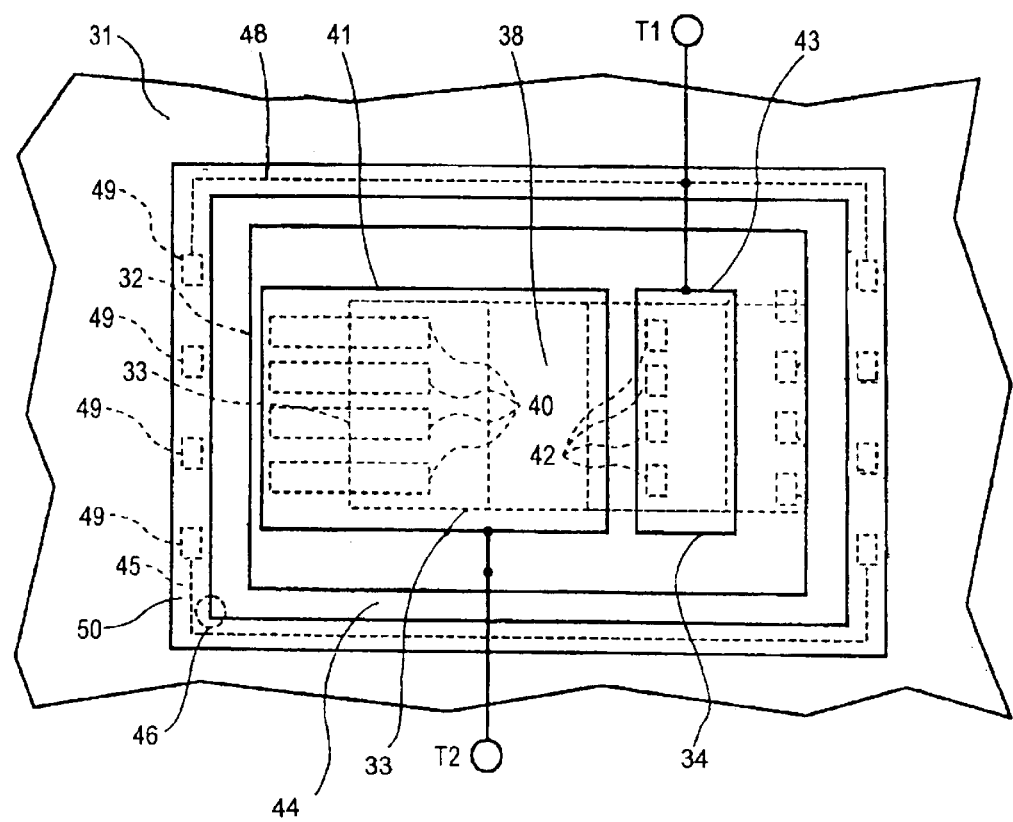
FIG. 4 is a plan view showing the protection circuit 12.
Figure 5:
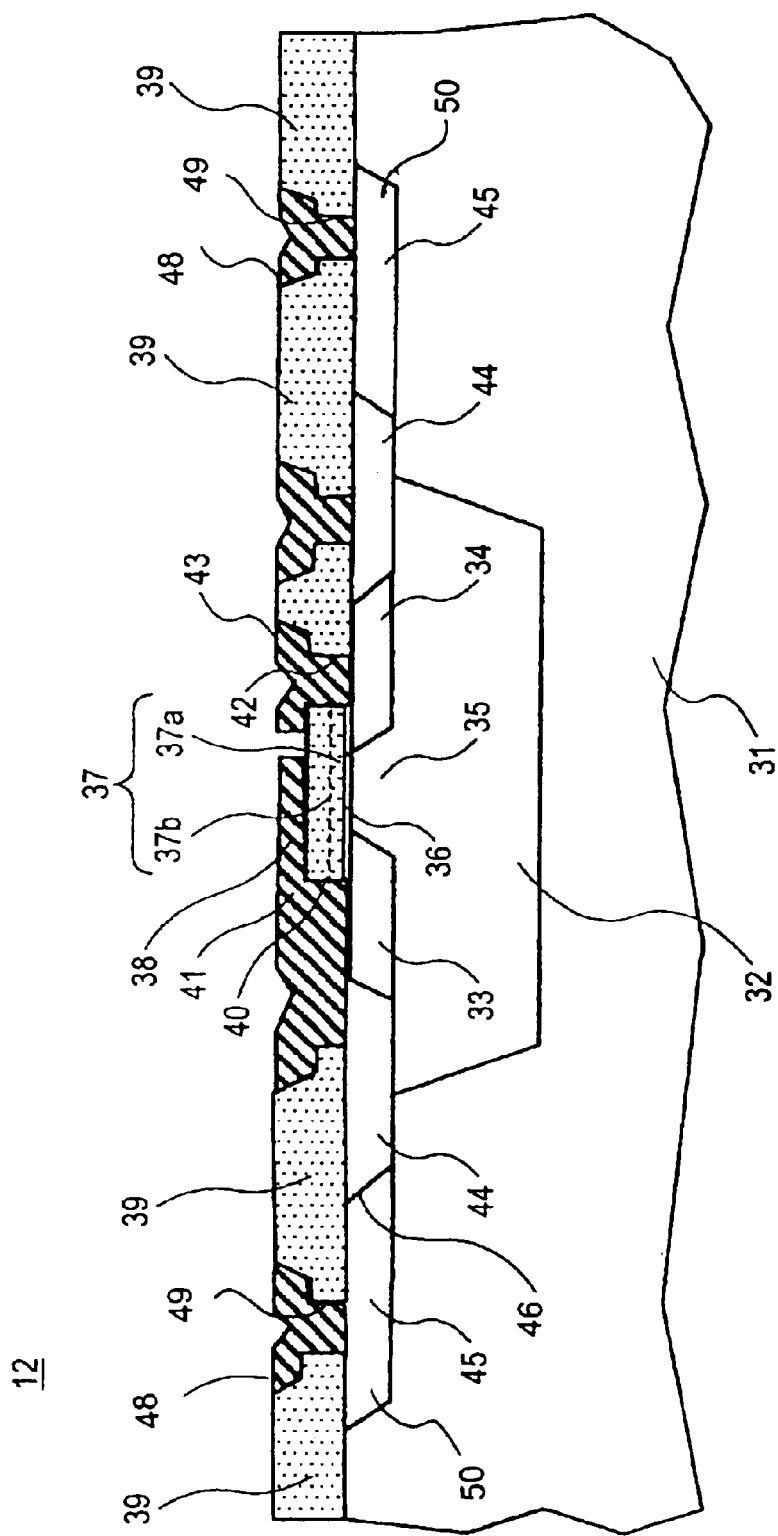
FIG. 5 is a sectional view showing the protection circuit 12.

FIG. 4 is a plan view showing the protection circuit 12 and FIG. 5 is a sectional view showing the protection circuit 12.

The field effect transistor Q1 is formed in a P-type well region 32 formed on an N-type semiconductor substrate 31. In the P-type well region 32, a high-density N-type diffused region 33 which is a source region and a high-density N-type diffused region 34 which is a drain region are formed. A channel region is formed between the N-type diffused region 33 and the N-type diffused region 34.

A gate oxide film 36 comprised of an SiO2 film having the thickness of approximately 40 nm is formed on a channel formed part 35 in which the channel region is formed. Further, a protective layer 37 is formed on the gate oxide film 36. The protective layer 37 is composed of an insulating film 37a made of an NSG film having the thickness of 120 nm for example and an insulating film 37b made of a BPSG film having the thickness of approximately 480 nm for example. Metal gate wiring 38 made of aluminum for example is formed on the protective layer 37. The metal gate wiring 38 is connected to a terminal T2.

As described above, the gate of the field effect transistor Q1 has metal gate structure and as the film is thick in the structure, the breakdown of the oxide film is seldom caused. As the total thickness is approximately 640 nm and is thick because the protective layer 37 is formed on the gate oxide film 36 at a metal gate, the withstand voltage is large. Therefore, the gate has the structure that can withstand convergent discharge sufficiently.

In case the gate insulating film is formed by only the gate oxide film having the thickness of approximately 40 nm and made of SiO2, the withstand voltage is 40 V, while the withstand voltage can be increased up to 700 V by providing the gate insulating film having the thickness of approximately 640 nm as in this embodiment.

Besides, a contact hole 40 is formed above the N-type diffusion region 33 forming the source region. The metal gate wiring 38 is arranged in the contact hole 40. The metal gate wiring 38 is connected to terminal T2 as shown at 41 of FIG. 5.

Further, a contact hole 42 is formed over the N-type diffused region 34 forming a drain region of a protective film 39 having the same configuration as that of the protective layer 37. A drain wiring 43 is formed in the contact hole 42. The drain wiring 43 is connected to a terminal T1.

Besides, in the well region 32, a P-type diffused region 44 called a channel stopper for applying bias potential to the well region 32 is formed. The P-type diffused region 44 is formed across the well region 32 and the semiconductor substrate 31 in the periphery.

In the P-type diffused region 44, the contact hole 40 is formed through the N-type diffused region 33 and connected to the metal gate wiring 38.

Further, a high-density N-type diffused region 45 is formed on the periphery 50 of the P-type diffused region 44. The N-type diffused region 45 is contacted to the P-type diffused region 44 and forms a PN junction 46 together with the P-type diffused region 44. The PN junction 46 functions as the diode D1. At his time, as the P-type diffused region 44 and the N-type diffused region 45 respectively forming the PN junction 46 become high-density impurities diffused regions, the quantity of withstand voltage can be enhanced, compared with a parasitic diode formed by the semiconductor substrate 31 and the well region 32, and the impedance can be reduced, as schematically depicted (in dashed lines) as contact hole 49 and wiring 48.

The N-type diffused region 45 is connected to wiring 48 made of aluminum via a contact hole 47. The wiring 48 is connected to the terminal T1.

As described above, as the diode D1 is formed by extending the P-type diffused region 44 forming a channel stopper of the field effect transistor Q1 outside the well region 32 and contacting the P-type diffused region to the high-density N-type diffused region 45, the diode D1 is not required to be formed in another region and the space can be reduced.

Plural field effect transistors and plural diodes can be also formed using a common well region.

Figure 6:
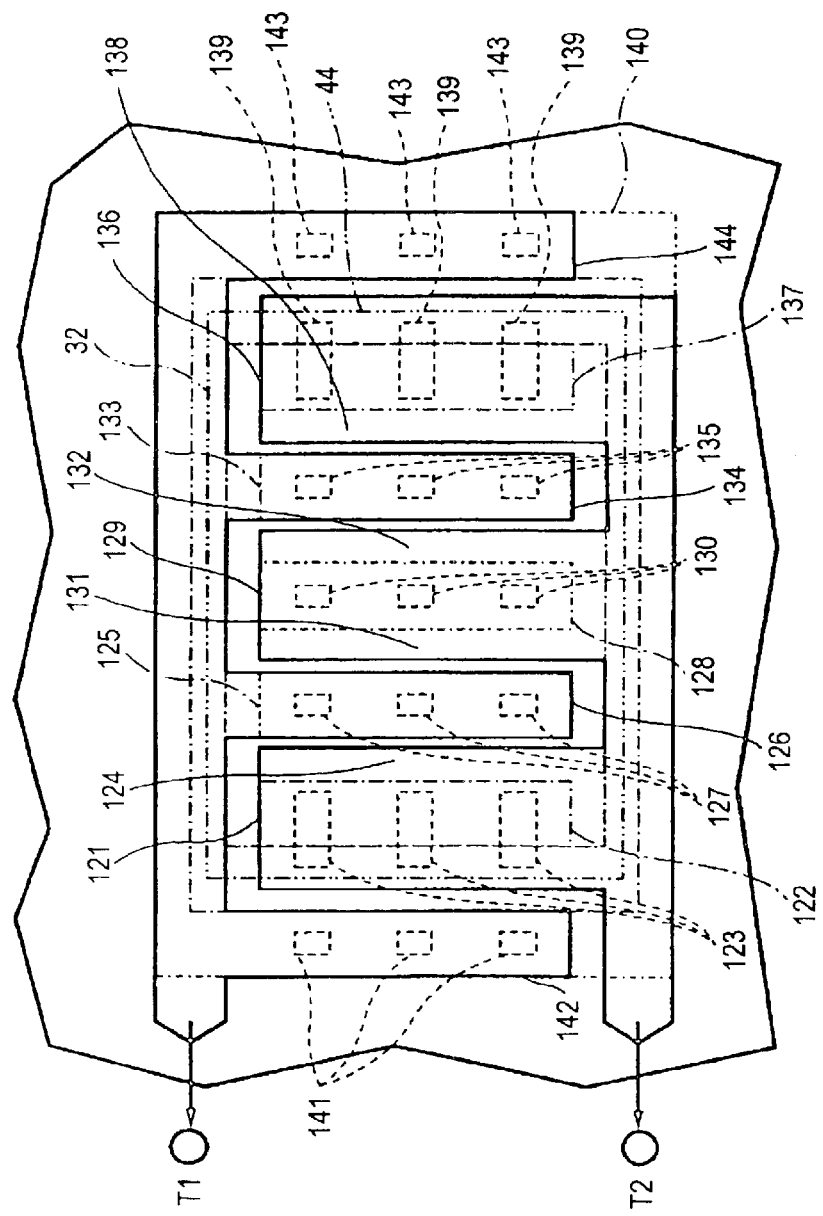
FIG. 6 is a plan view showing a transformed example of the protection circuit 12.
Figure 7:
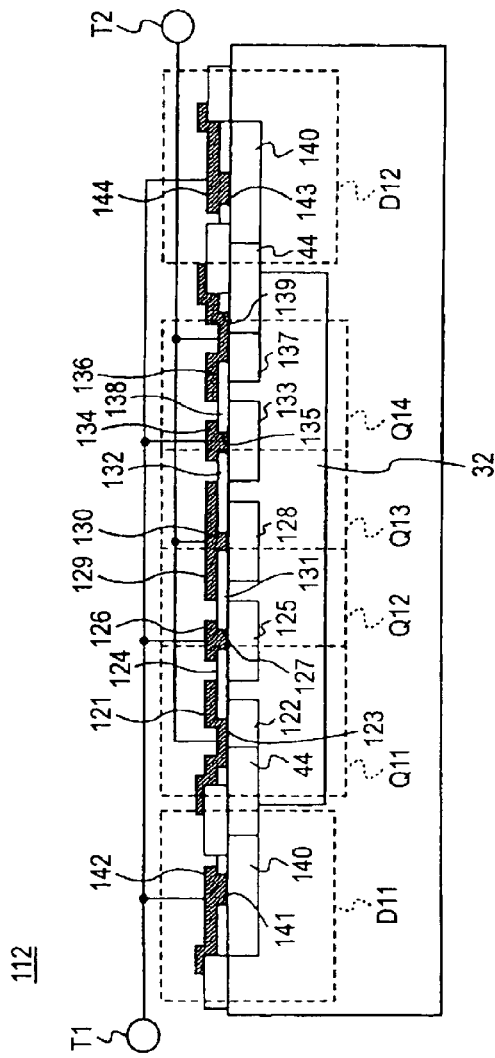
FIG. 7 is a sectional view showing the protection circuit 12 according to a second embodiment of the invention.

FIG. 6 is a plan view showing the protection circuit 12 according to the second embodiment of invention and FIG. 7 is a sectional view showing the protection circuit 12 of the second embodiment. The same reference number is allocated to the same component as that shown in FIGS. 4 and 5 and the description is omitted.

A protection circuit 112 in this embodiment has first to fourth field effect transistors Q11 to Q14 are formed in a well region 32 and a first diode D11 and a second diode D12 are formed outside the first to fourth field effect transistors using a P-type diffused region 44 forming a channel stopper.

The first field effect transistor Q11 is provided with source/gate wiring 121. The source/gate wiring 121 is formed across an insulating film 124 on a source diffused region 122 and a channel region and the P-type diffused region 44 forming the channel stopper, and is connected to the source diffused region 122 and the P-type diffused region 44 via a contact hole 123. The insulating film 124 has structure in which a gate oxide film, an NSG film and a BPSG film are laminated as shown in FIG. 7 and their films form a thick layer. The source/gate wiring 121 is connected to a terminal T2.

Besides, the first field effect transistor Q11 and the second field effect transistor Q12 have structure in which a drain diffused region 125 and drain wiring 126 are shared. The drain wiring 126 is connected to the drain diffused region 125 via a contact hole 127. The drain wiring 126 is connected to the terminal T2.

Besides, the second field effect transistor Q12 and the third field effect transistor Q13 share a source diffused region 128 and source/gate wiring 129. The source/gate wiring 129 is connected to the source diffused region 128 via a contact hole 130 and is formed across insulating films 131, 132 over each gate region. The insulating films 131, 132 have structure in which a gate oxide film, an NSG film and a BPSG film are laminated as shown in FIG. 7 and their films form a thick layer. The source/gate wiring 129 is connected to the terminal T2 connected to an input terminal Tin.

Further, the third field effect transistor Q13 and the fourth field effect transistor Q14 share a drain diffused region 133 and drain wiring 134. The drain wiring 134 is connected to the drain diffused region 133 via a contact hole 135. The drain wiring 134 is connected to a terminal T1 connected to a power supply terminal Ts.

Besides, the fourth field effect transistor Q14 is provided with source/gate wiring 136. The source/gate wiring 136 is formed across a source diffused region 137, an insulating film 138 and the P-type diffused region 44 forming a channel stopper, and is connected to the diffused region for a source contact 137 and the P-type diffused region 44 via a contact hole 139. The insulating film 138 has structure in which a gate oxide film, an NSG film and a BPSG film are laminated as shown in FIG. 7 and their films form a thick layer. The source/gate wiring is connected to the terminal T2 connected to the input terminal Tin.

The diode D is composed of the P-type diffused region 44 forming a channel stopper and a high-density N-type diffused region 140 formed outside the P-type diffused region 44. The diodes D11 and D12 have configuration that the N-type diffused region 140 is respectively connected to anode wiring 142, 144 via each contact hole 141, 143 formed on the upside of the N-type diffused region 140. The anode wirings 142, 144 are connected to the terminal T1 connected to the power supply terminal Ts. Besides, the diodes D11 and D12 have configuration that the P-type diffused region 44 is connected to the source/gate wiring 121/the drain wiring 136 which are respectively cathode wiring via each contact hole 123, 139 formed on the upside of the P-type diffused region 44. The wirings 121, 136 are connected to the terminal T1 connected to the power supply terminal Ts.

Figure 8:
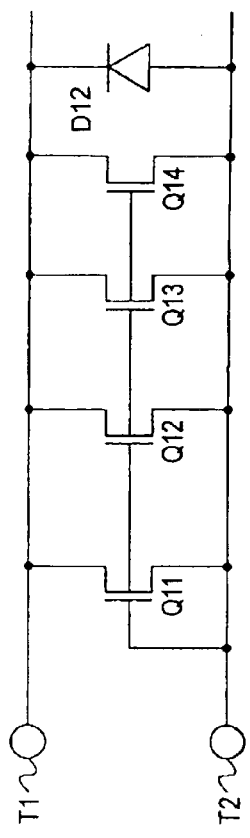
FIG. 8 shows an equivalent circuit of the second embodiment of the protection circuit 12.

FIG. 8 shows an equivalent circuit of the protection circuit 112.

The protection circuit 112 is composed of the first field effect transistor Q1 to the fourth field effect transistor Q14 and the diode D11. The first field effect transistor Q11 to the fourth field effect transistor Q14 have configuration that each source is connected to the terminal T1, each drain is connected to the terminal T2 and each gate and each back gate are connected to the terminal T1. The diode D11 has configuration that the anode is connected to the terminal T1 and the cathode is connected to the terminal T2.

According to this embodiment, as current can be absorbed by the plural transistors of the first field effect transistor Q11 to the fourth field effect transistor Q14 and the plural diodes of the diodes D11 and D12, the protection circuit can deal with heavy-current. As the plural transistors and the plural diodes can be collectively formed in the periphery of one well region 32, an isolating region for isolating each element is not required and the protection circuit 112 can be miniaturized. Besides, as the diffused regions and the wiring can be shared by the first field effect transistor Q11 to the fourth field effect transistor Q14, the first diode D11 and the second diode D12, the wiring can be simplified.

A resistor for generating impedance may be also inserted between an internal circuit 11 and the protection circuit 12.

Figure 9:
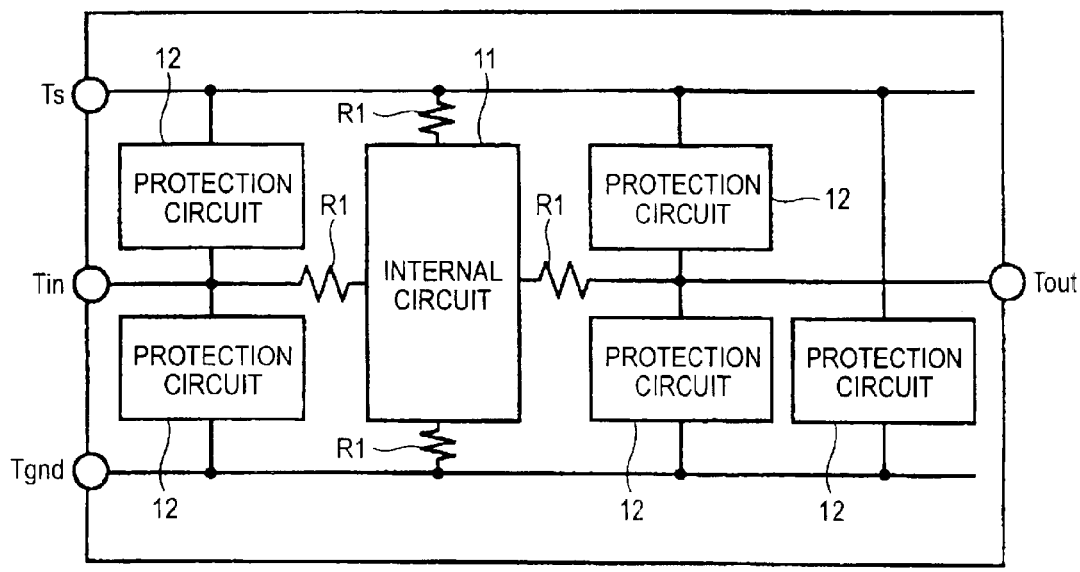
FIG. 9 is a circuit diagram showing the protection circuit 12 according to a third embodiment of the invention.

FIG. 9 is a block diagram showing the semiconductor device according to the third embodiment of the invention. The same reference number is allocated to the same component as that shown in FIG. 1 and the description is omitted.

In a semiconductor device 200 in this embodiment, a resistor R1 is inserted between an internal circuit 11 and a protection circuit 12. The resistor R1 is set to larger impedance than the impedance of the protection circuit 12 when the protection circuit 12 is operated.

Heavy-current can be prevented from flowing on the side of the internal circuit 11 by inserting the resistor R1 between the internal circuit 11 and the protection circuit 12 when current is absorbed by the protection circuit 12.

In this embodiment, the description is made using the field effect transistor for an example, however, the similar circuit configuration can be also acquired using a bipolar transistor.

Figure 10:
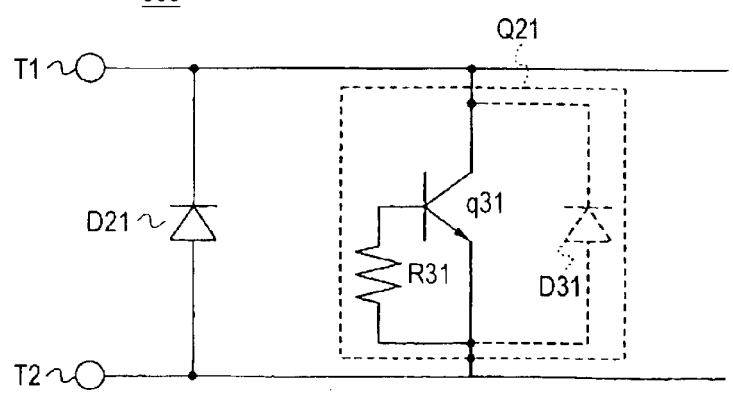
FIG. 10 is a circuit diagram showing a protection circuit using a bipolar transistor.
Figure 11:
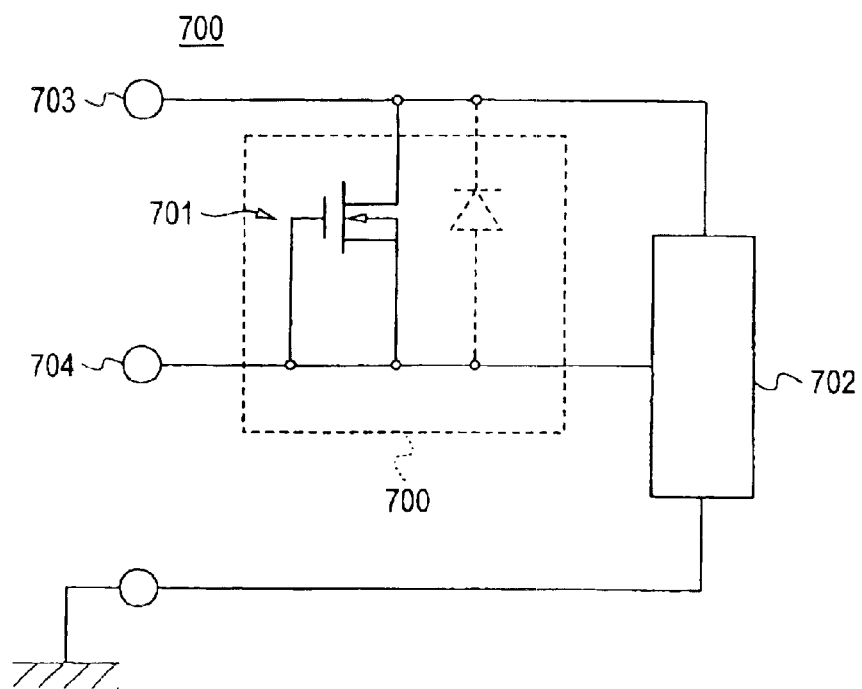
FIG. 11 is a circuit diagram showing a protection circuit using a field effect transistor.
Figure 12:
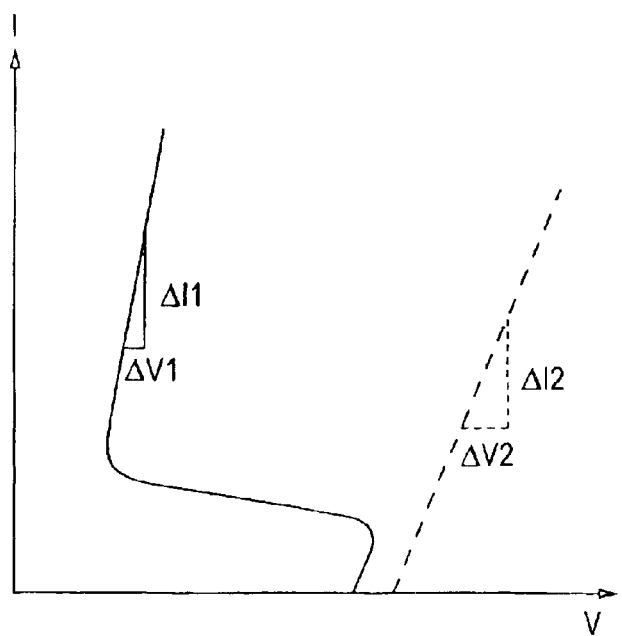
FIG. 12 shows characteristics of the protection circuit using the transistor.

FIG. 10 is a circuit diagram showing a protection circuit using a bipolar transistor.

The protection circuit 300 using the bipolar transistor is composed of a diode D21 and a bipolar transistor Q21. The bipolar transistor Q21 includes the body Q31 of the transistor, an internal resistor R31 and a parasitic diode D31. The diode D21 is provided separately from the parasitic diode D31 of the bipolar transistor Q21.

What is claimed is:

1. A semiconductor device, comprising:

a substrate;

a well region, formed in the substrate;

a field effect transistor, formed in the well region; and a diffused region, formed across the well region and the substrate for applying a back gate potential to the well region, and forming a PN diode junction together with a periphery of said diffused region, wherein the field effect transistor and the PN diode junction are connected between terminals for absorbing excess current so that an internal circuit connected to the terminals is protected.

2. The semiconductor device as set forth in claim 1, wherein a gate of the field effect transistor comprises:

a gate oxide film formed on a channel;

a protective film formed on the gate oxide film; and a gate electrode comprising conductive material formed on the protective film.

3. The semiconductor device as set forth in claim 2, wherein the gate of the field effect transistor is comprised of metal.

4. The semiconductor device as set forth in claim 1, wherein the field effect transistor is a plurality of field effect transistors which are provided in the well region; and wherein the field effect transistors share a gate structure and a drain structure.

5. The semiconductor device as set forth in claim 1, further comprising and impedance element having larger impedance than the impedance of the field effect transistor and a diode forming the PN diode junction in a case that the field effect transistor and the diode are turned on, wherein the impedance element is arranged between the internal circuit and at least one of the field effect transistor and the diode.

6. The semiconductor device as set forth in claim 1, further comprising a second diffused region connected to the diffused region so that the PN diode junction is formed with the diffused region.

7. A semiconductor device, comprising:

an internal circuit, connected to a plurality of terminals; and a protection circuit, connected between the terminals for protecting the internal circuit, wherein the protection circuit includes:

a first element, having a response to a potential difference pulse between terminals of said first element of a rising edge of current equivalent to that of a diode; and a second element, having an impedance equivalent to that of a transistor after the rising edge of current response of said first element.

8. The semiconductor device as set forth in claim 7, wherein said first element and said second element of said protection circuit are connected in parallel.

* * * * *